(12) United States Patent
Hasegawa et al.

(10) Patent No.: US 7,740,703 B2
(45) Date of Patent: Jun. 22, 2010

(54) SEMICONDUCTOR FILM FORMATION DEVICE

(75) Inventors: Mitsuru Hasegawa, Tokyo (JP);
Akihiro Miyauchi, Tokyo (JP);
Kazutoshi Watanabe, Tokyo (JP);
Meguro Takeshi, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 164 days.

(21) Appl. No.: 10/803,087

(22) Filed: Mar. 18, 2004

(65) Prior Publication Data
US 2004/0250773 A1    Dec. 16, 2004

(30) Foreign Application Priority Data
Mar. 18, 2003    (JP)    .............. 2003-072909

(51) Int. Cl.
*C23C 16/46* (2006.01)
*C23C 16/458* (2006.01)
*C23C 16/48* (2006.01)
*C23C 16/52* (2006.01)
*C23C 16/06* (2006.01)
*C23C 16/22* (2006.01)

(52) U.S. Cl. .................. 118/715; 118/641; 118/69; 156/345.27; 156/345.52

(58) Field of Classification Search .............. 118/715, 118/641, 69; 156/345.29
See application file for complete search history.

(56) References Cited

U.S. PATENT DOCUMENTS

| | | | | | |
|---|---|---|---|---|---|
| 4,920,918 | A | * | 5/1990 | Adams et al. | 118/724 |
| 4,926,793 | A | * | 5/1990 | Arima et al. | 118/730 |
| 5,592,581 | A | * | 1/1997 | Okase | 392/418 |
| 5,849,076 | A | * | 12/1998 | Gaylord et al. | 117/85 |
| 5,863,843 | A | * | 1/1999 | Green et al. | 438/771 |
| 5,961,850 | A | * | 10/1999 | Satou et al. | 216/67 |
| 6,036,878 | A | * | 3/2000 | Collins | 216/68 |
| 6,176,929 | B1 | * | 1/2001 | Fukunaga et al. | 118/715 |
| 6,228,174 | B1 | * | 5/2001 | Takahashi | 118/725 |
| 6,308,654 | B1 | * | 10/2001 | Schneider et al. | 118/723 I |
| 6,491,518 | B1 | * | 12/2002 | Fujikawa et al. | 432/241 |
| 6,749,687 | B1 | * | 6/2004 | Ferro et al. | 117/89 |
| 6,790,311 | B2 | * | 9/2004 | Collins et al. | 156/345.48 |
| 2004/0060512 | A1 | * | 4/2004 | Waldhauer et al. | 118/715 |

FOREIGN PATENT DOCUMENTS

| | | | | |
|---|---|---|---|---|
| JP | 61018124 | A | * | 1/1986 |
| JP | 61026218 | A | * | 2/1986 |
| JP | 61279120 | A | * | 12/1986 |
| JP | 63083275 | A | * | 4/1988 |
| JP | 01025985 | A | * | 1/1989 |
| JP | 4-132213 | | | 5/1992 |
| JP | 06010142 | A | * | 1/1994 |

* cited by examiner

OTHER PUBLICATIONS

Machine Translation of JP 06010142 A.*

*Primary Examiner*—Rudy Zervigon
(74) *Attorney, Agent, or Firm*—McGinn IP Law Group, PLLC

(57) ABSTRACT

A semiconductor film formation device has: a reaction vessel that includes a gas flow path to allow source gas to pass through and a substrate mount site provided in the gas flow path to mount a substrate; a temperature control means that is disposed opposite to the substrate mount site and close to the reaction vessel to control the internal temperature of the reaction vessel; and a thermal conductivity adjusting member that is disposed between the reaction vessel and the temperature control means. The thermal conductivity adjusting member has a section with a thermal conductivity different from the other section along the gas flow path.

16 Claims, 9 Drawing Sheets

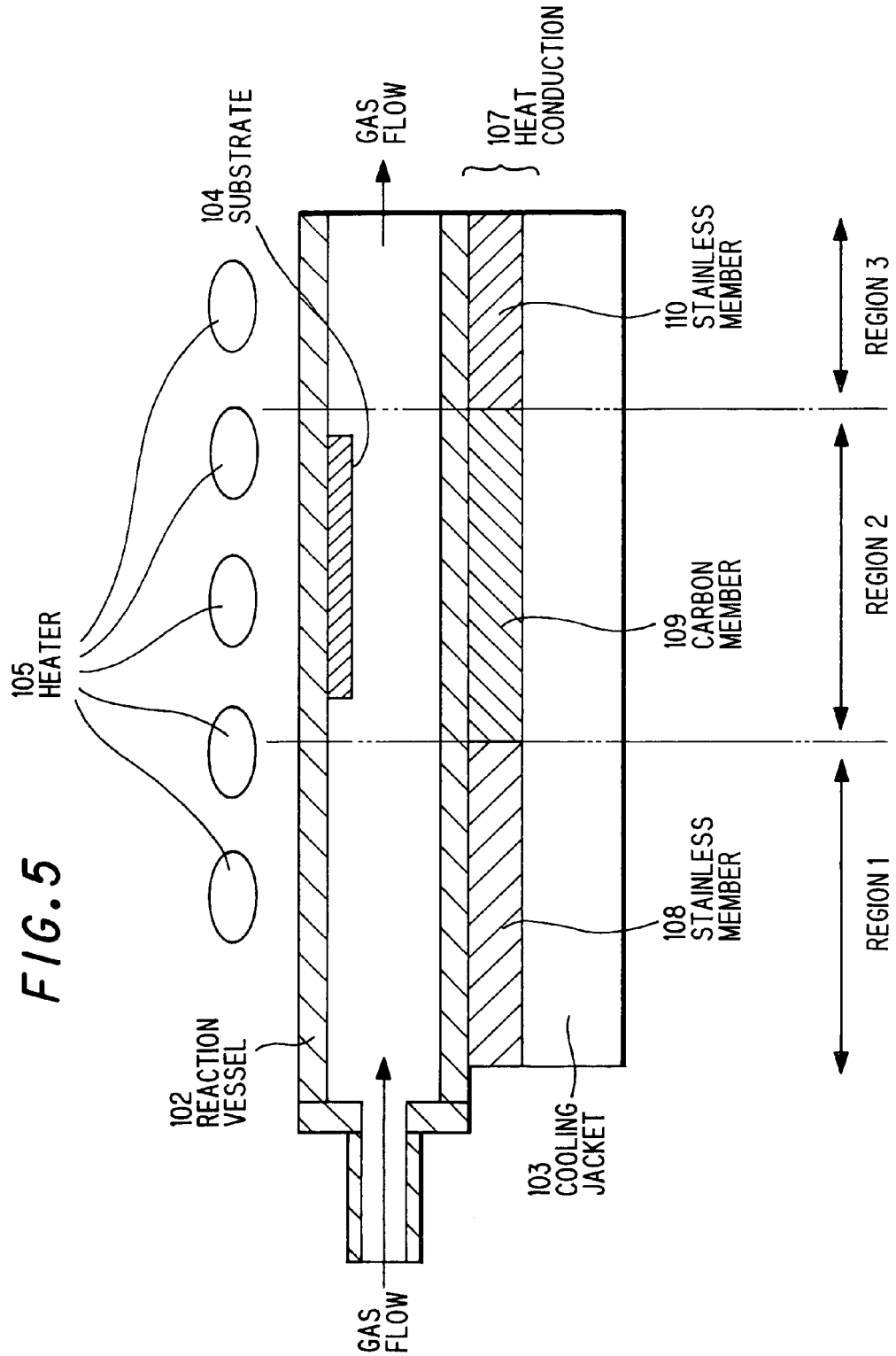

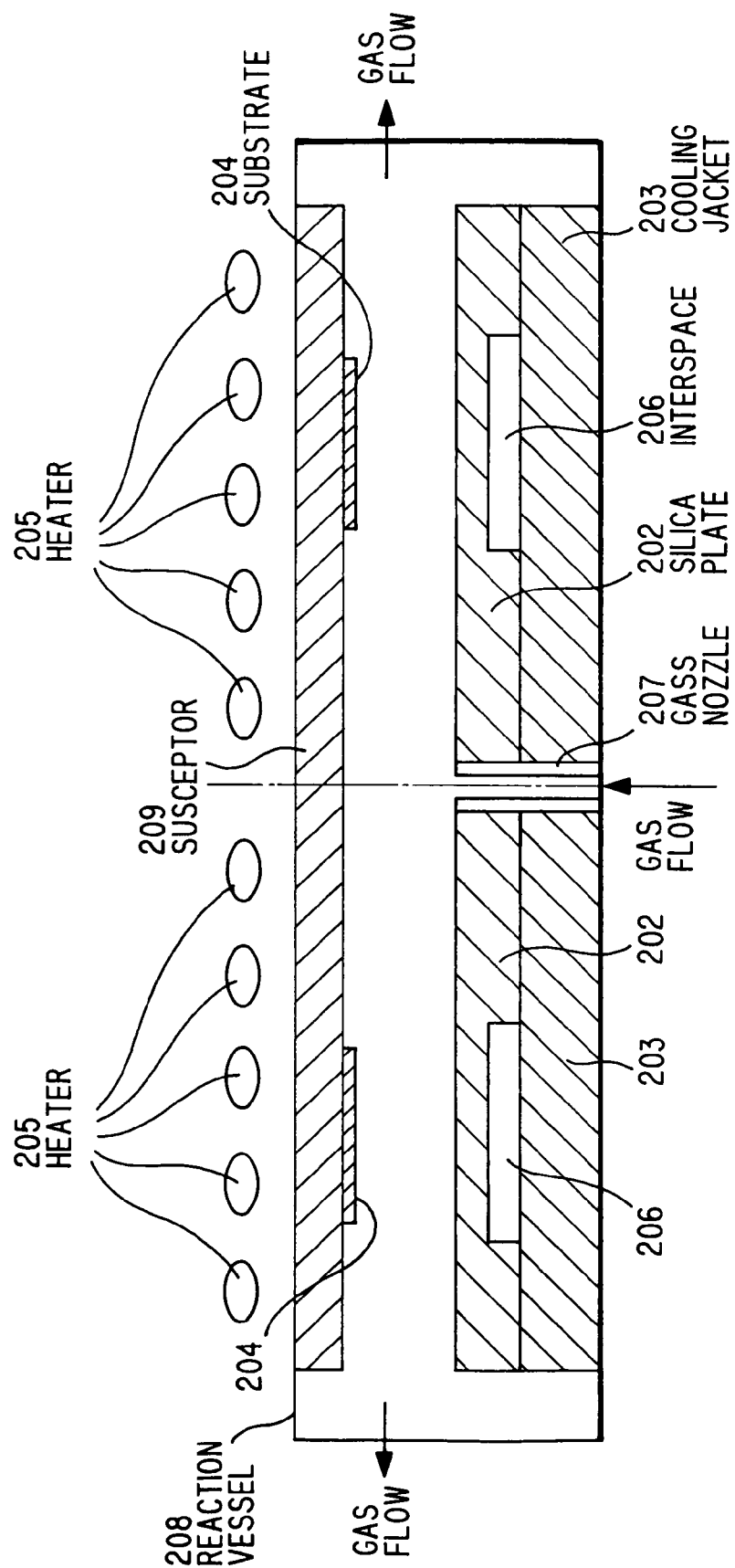

SEMICONDUCTOR FILM FORMATION DEVICE

The present application is based on Japanese patent application No. 2003-072909, the entire contents of which are incorporated herein by reference.

BACKGROUND OF THE INVENTION

1. Field of the Invention

The invention relates to a semiconductor film formation device and, particularly, to a semiconductor film formation device that is provided with a temperature control means to control the internal temperature of reaction vessel to offer a good evenness in film thickness and composition ratio.

2. Description of the Related Art

Conventionally, the CVD (chemical vapor deposition) method is used to grow a semiconductor film on the surface of a wafer. In the CVD method, source gases supplied into a reaction vessel react with each other on the surface of a substrate disposed in the reaction vessel and its reacted product is deposited on the substrate while being grown as a semiconductor film. It is desired that the semiconductor film thus produced has a good evenness in thickness, composition and impurity distribution. Such evenness is influenced by conditions of gas flow and temperature distribution in the reaction vessel. Thus, it is important to finely control these conditions to have a semiconductor film with good evenness.

Japanese patent application laid-open No. 4-132213 discloses a semiconductor film formation device that the internal temperature distribution of reaction vessel is controlled by providing pipes for coolant in the wall of reaction vessel and by separately setting the temperature or flow rate of coolant to be supplied through the pipes.

However, the conventional semiconductor film formation device has problems as below.

The device is complicated in its structure since it needs to provide pipes for coolant in the wall of reaction vessel. Therefore, the manufacturing cost must be increased.

Further, the device is complicated in its operation since it needs to separately set the temperature or flow rate of coolant to be supplied through the pipes. Therefore, the operating or maintenance cost must be increased.

SUMMARY OF THE INVENTION

It is an object of the invention to provide a semiconductor film formation device that the internal temperature distribution of reaction vessel can be suitably conducted while simplifying its structure and operation.

According to a first aspect of the invention, a semiconductor film formation device comprises:

a reaction vessel that includes a gas flow path to allow source gas to pass through and a substrate mount site provided in the gas flow path to mount a substrate;

a temperature control means that is disposed opposite to the substrate mount site and close to the reaction vessel to control the internal temperature of the reaction vessel; and a thermal conductivity adjusting member that is disposed between the reaction vessel and the temperature control means;

wherein the thermal conductivity adjusting member has a first section with a thermal conductivity different from the other section along the gas flow path.

According to a second aspect of the invention, a semiconductor film formation device comprises:

a reaction vessel that includes a gas flow path to allow source gas to pass through and a substrate mount site provided in the gas flow path to mount a substrate; and a temperature control means that is disposed opposite to the substrate mount site and close to the reaction vessel to control the internal temperature of the reaction vessel;

wherein the reaction vessel has a section with a wall thickness smaller than the other section to form an interspace between the reaction vessel and the temperature control means.

According to a third aspect of the invention, a semiconductor film formation device comprises:

a reaction vessel that includes a gas flow path to allow source gas to pass through and a substrate mount site provided in the gas flow path to mount a substrate;

a temperature control means that is disposed opposite to the substrate mount site and close to the reaction vessel to control the internal temperature of the reaction vessel;

a plate member that is disposed opposite to the substrate mount site in the gas flow path; and a thermal conductivity adjusting member that is disposed between the temperature control means and the plate member;

wherein the thermal conductivity adjusting member has a first section with a thermal conductivity different from the other section along the gas flow path.

According to a fourth aspect of the invention, a semiconductor film formation device comprises:

a reaction vessel that includes a gas flow path to allow source gas to pass through and a substrate mount site provided in the gas flow path to mount a substrate;

a temperature control means that is disposed opposite to the substrate mount site and close to the reaction vessel to control the internal temperature of the reaction vessel; and a plate member that is disposed opposite to the substrate mount site in the gas flow path;

wherein the reaction vessel has a section with a wall thickness smaller than the other section to form an interspace between the reaction vessel and the temperature control means.

BRIEF DESCRIPTION OF THE DRAWINGS

The preferred embodiments according to the invention will be explained below referring to the drawings, wherein:

FIG. 5 is a schematic cross sectional view showing a semiconductor film formation device in a second preferred embodiment of the invention;

FIG. 9 is a schematic cross sectional view showing a modification of the semiconductor film formation device in the fourth embodiment.

DETAILED DESCRIPTION OF THE PREFERRED EMBODIMENTS

First Embodiment

Figure 1:
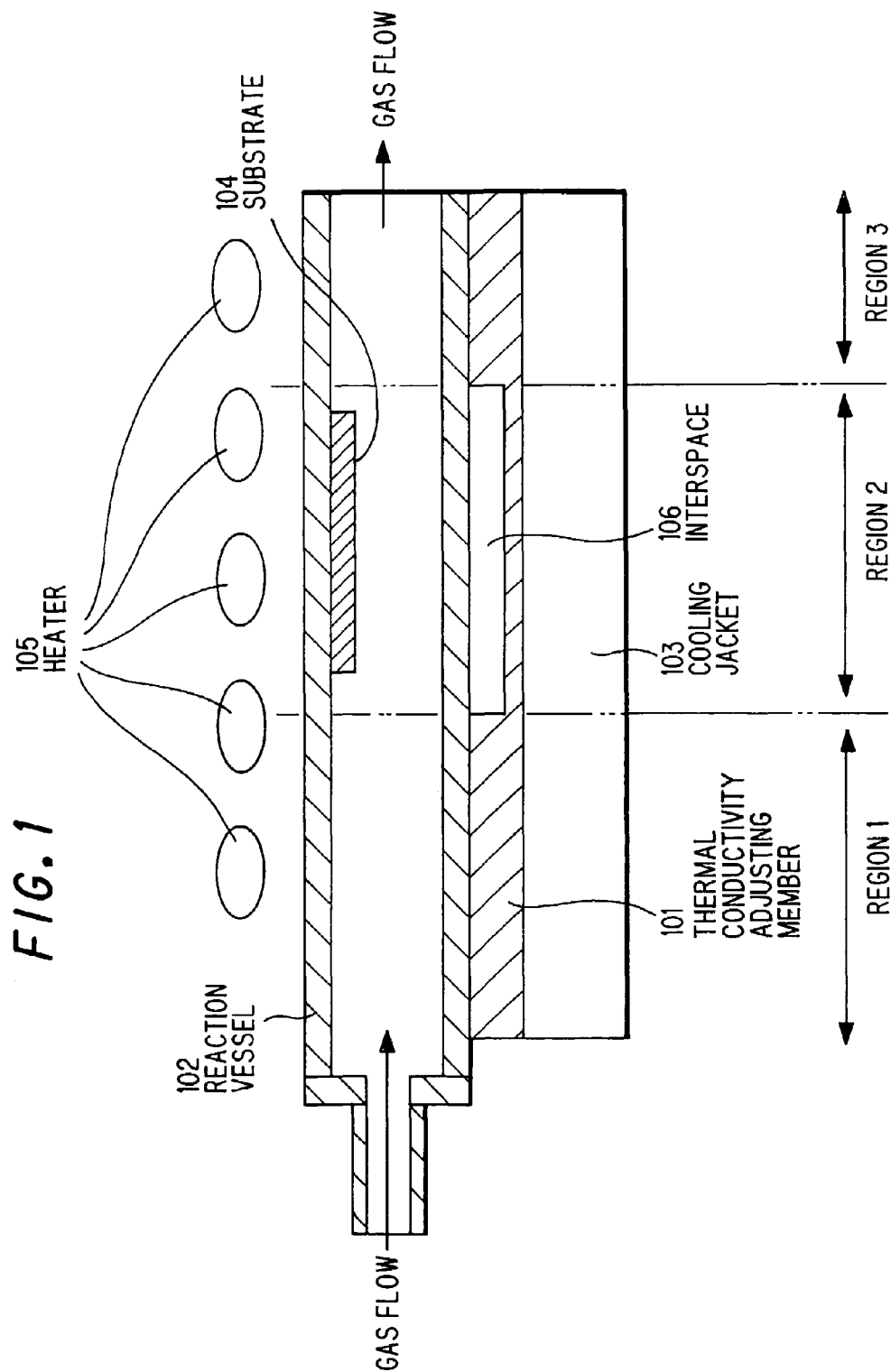
FIG. 1 is a schematic cross sectional view showing a semiconductor film formation device in a first preferred embodiment of the invention.

FIG. 1 is a cross sectional view showing a semiconductor film formation device in the first preferred embodiment of the invention.

A reaction vessel 102 of silica glass is provided with a substrate 104 of single-crystal gallium arsenide disposed on its inner surface. Source gas to form semiconductor film and carrier gas to carry the source gas are supplied into the left opening of the reaction vessel 102, passing through the surface of the substrate 104, discharged from the right opening of the reaction vessel 102. The source gas is arsine ($AsH_3$) gas as V group source gas and trimethylgallium (TMG) gas as III group source gas, and the carrier gas is hydrogen gas.

The reaction vessel 102 is also provided with heaters 105 on its one outer surface, and the temperature of substrate 104 is thereby set to be 600° C. The reaction vessel 102 is further provided with a cooling jacket 103 of stainless steel to cool the reaction vessel 102 on the other outer surface. The cooling jacket 103 is connected to the reaction vessel 102 through a thermal conductivity adjusting member 101 of carbon.

As shown in FIG. 1, the thermal conductivity adjusting member 101 has a difference in thickness between regions. Namely, it has a full thickness in regions 1 and 3 and a reduced thickness in region 2, whereby, in region 2, an interspace 106 with a rectangular cross section is formed between the thermal conductivity adjusting member 101 and the outer surface of reaction vessel 102. Due to the existence of interspace 106, the thermal conductivity of the thermal conductivity adjusting member 101 in region 2 lowers as compared to that in regions 1 and 3. As a result, the cooling effect in region 2 lowers as compared to that in regions 1 and 3.

Semiconductor films are grown by using the semiconductor film formation device of this embodiment, which is provided with the thermal conductivity adjusting member 101, and by using a semiconductor film formation device without the thermal conductivity adjusting member 101. Then, between the semiconductor films thus grown, its average growth rate and in-plane thickness distribution are evaluated. The average growth rate is increased to 12 nanometers/sec, in case of with the thermal conductivity adjusting member 101, while it is 10 nanometers/sec. in case of without the thermal conductivity adjusting member 101. The in-plane thickness distribution is ±1.0 percent in case of with the thermal conductivity adjusting member 101, while it is ±2 percents in case of without the thermal conductivity adjusting member 101. Thus, the evenness of film thickness is improved in this embodiment.

The reasons why the above results are obtained will be described below.

In region 1 where the source gas and carrier gas are firstly introduced in the reaction vessel 102, the cooling effect at the lower inside of reaction vessel 102 is predominant. Therefore, a large temperature gradient is formed in the reaction vessel 102. When the mixed gases are introduced into region 1, there occurs a thermal diffusion phenomenon that relatively heavy molecules are diffused to a low-temperature region. So, the source gas concentrates to the low-temperature region on the lower side of reaction vessel 102. As a result, the concentration of source gas on the upper side of reaction vessel 102 lowers and the deposition of semiconductor film on the wall surface is reduced. Thus, the wasting of source gas can be prevented.

Subsequently, in region 2 near the substrate 104, the cooling effect at the lower inside of reaction vessel 102 lowers. Therefore, the temperature gradient formed in the reaction vessel 102 reduces and the thermal diffusion effect lovers. Thereby, the source gas flown concentrating the lower inside of reaction vessel 102 in region 1 is diffused to the upper inside of reaction vessel 102 according as the thermal diffusion effect lowers. Thus, it is assumed that the growth rate is enhanced since the concentration of source gas rises near the surface of substrate 104. Also, it is assumed that the evenness of in-plane thickness distribution is improved since the wasting of source gas in region 1 is suppressed and, therefore, the source gas near the substrate 104 does not get low rapidly.

Then, in region 3 on the downstream side of substrate 104, the cooling effect by the cooling jacket 103 increases again, the source gas concentrates to the lower inside of reaction vessel 102, and the deposition of semiconductor film on the wall surface is reduced.

Figure 2:
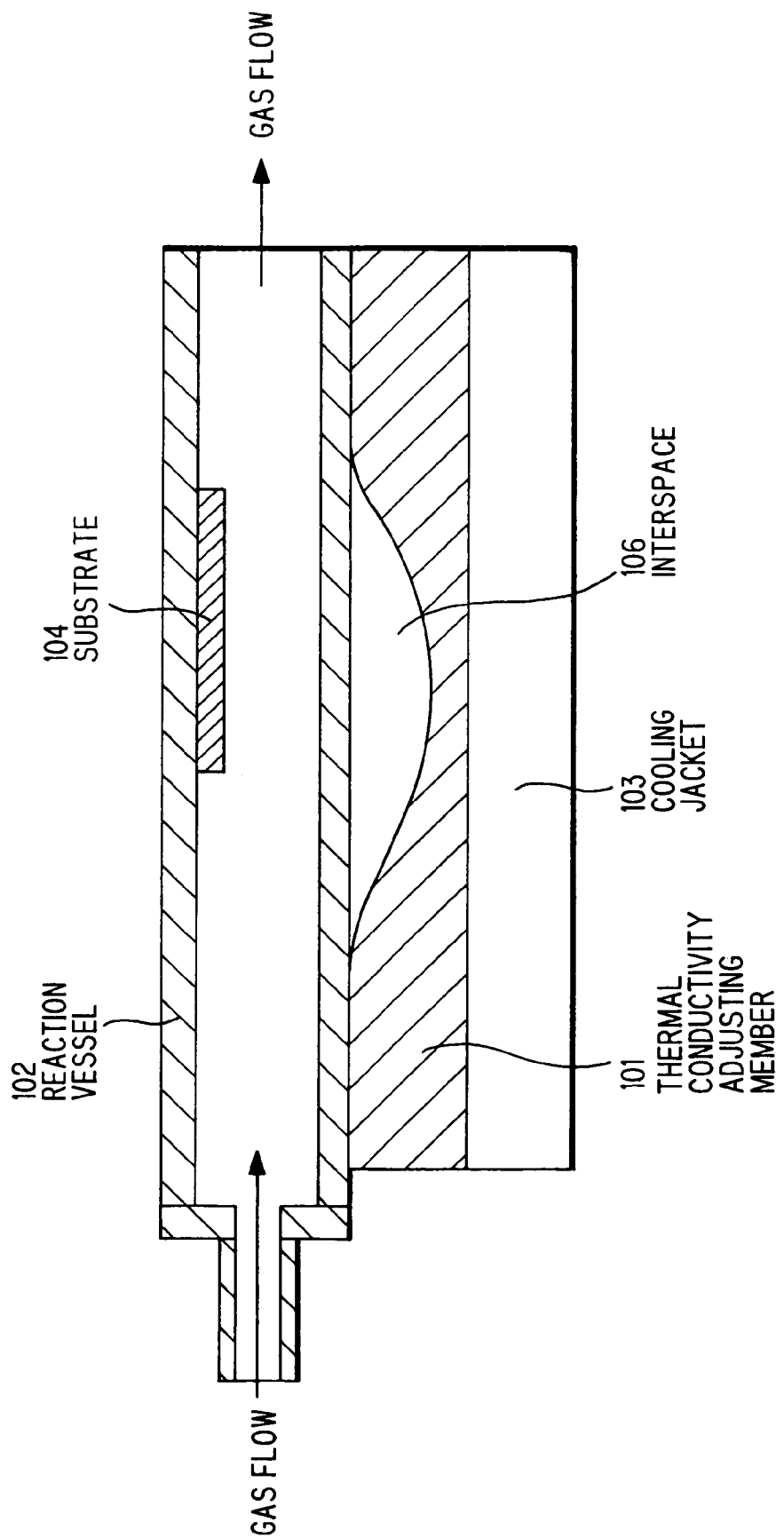
FIG. 2 is a schematic cross sectional view showing a modification of the semiconductor film formation device in the first embodiment.
Figure 3:
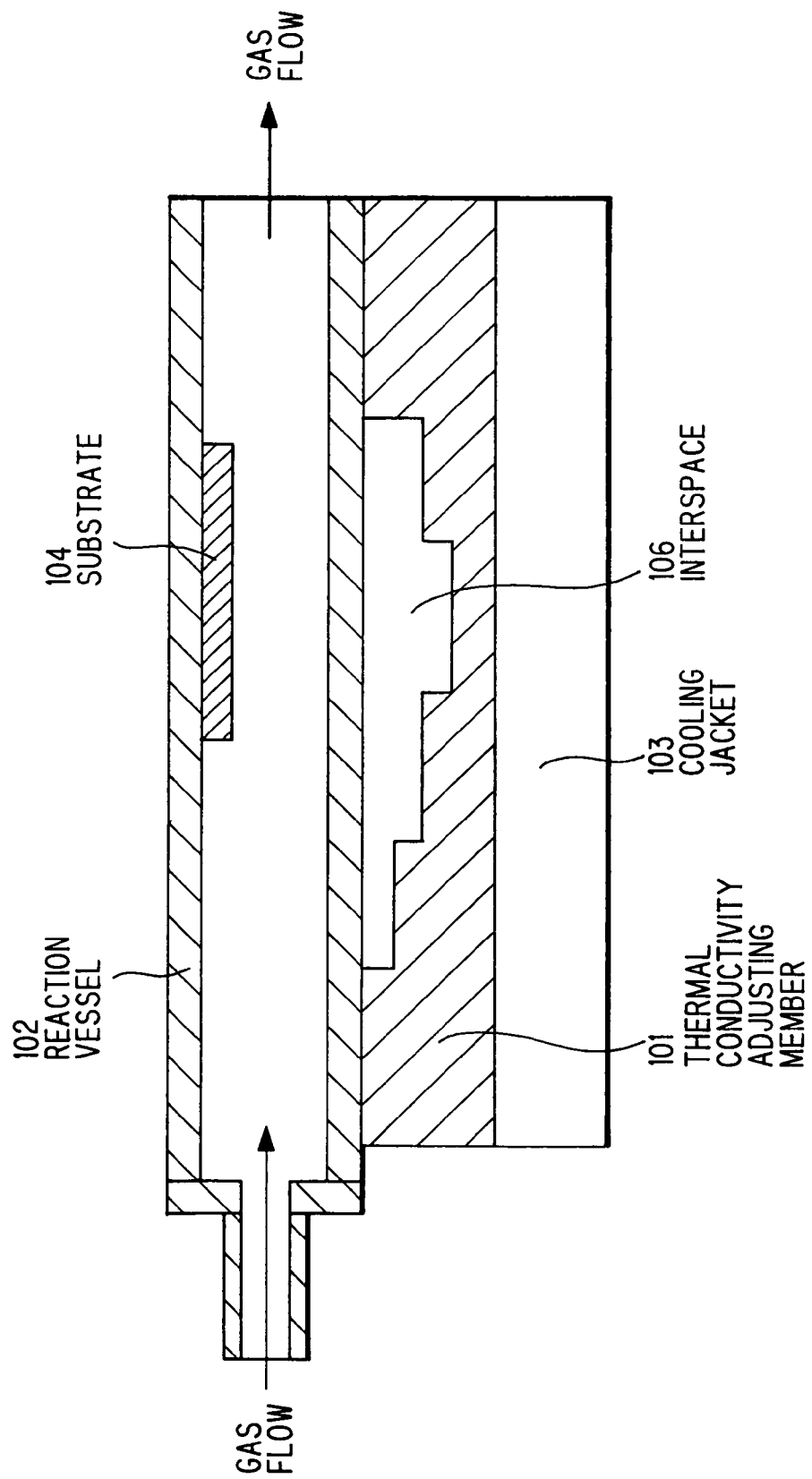
FIG. 3 is a schematic cross sectional view showing another modification of the semiconductor film formation device in the first embodiment.

Although in this embodiment the thermal conductivity adjusting member 101 has two-stage thickness portions, i.e., thick portion and thin portion, it may have a curved cross section as shown in FIG. 2 or a stepwise cross section as shown in FIG. 3. In other words, due to the curved cross section or stepwise cross section, there is formed an interspace 106 having a variable height along the direction of gas flow between the thermal conductivity adjusting member 101 and the outer surface of reaction vessel 102. According as the height of interspace 106 increases, the thermal conductivity of the thermal conductivity adjusting member 101 lowers. Namely, the cooling effect is minimized at the maximum height of interspace 106. In this way, temperature distribution in each region can be further finely controlled.

Figure 4A:
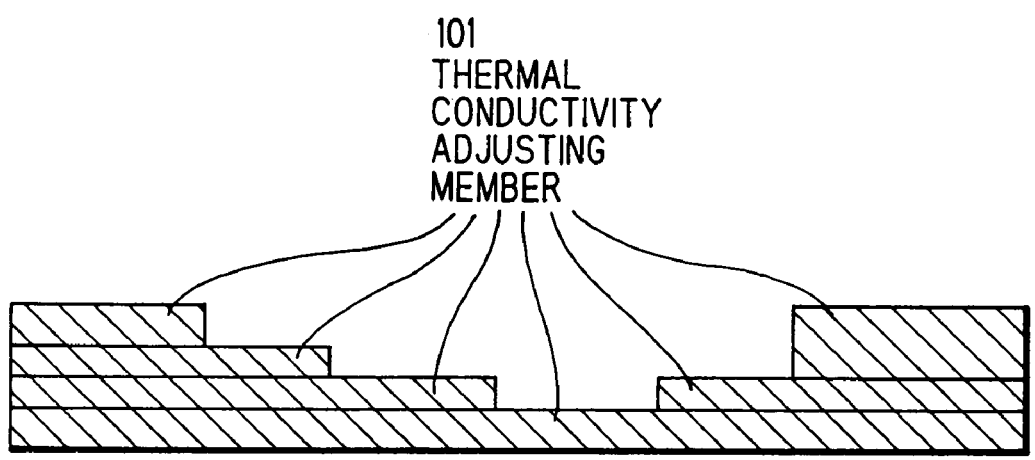
FIGS. 4A and 4B are cross sectional views showing compositional examples of thermal conductivity adjusting member 101 in the first embodiment.
Figure 4B:
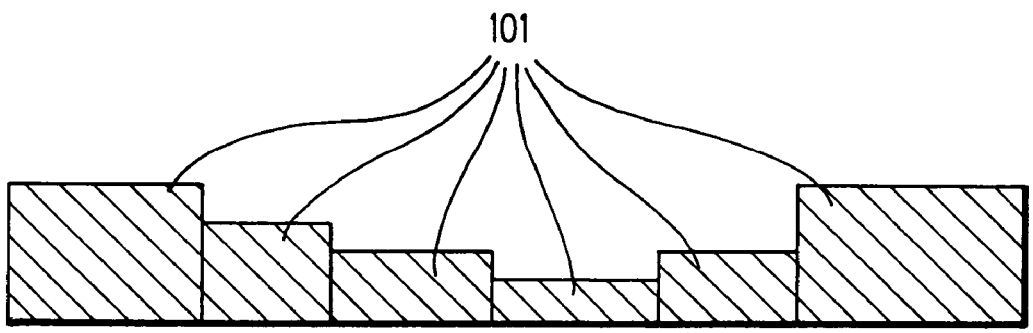

The method of providing the stepwise cross section with the thermal conductivity adjusting member 101 may be such that a plurality of thermal conductivity adjusting member members are stacked as shown in FIG. 4A or such that a plurality of thermal conductivity adjusting member members with different thicknesses are crosswise arranged as shown in FIG. 4A.

Although in this embodiment the thermal conductivity adjusting member 101 directly contacts the reaction vessel 102, these may be disposed through a gap without being directly contacted each other.

Although in this embodiment the thermal conductivity adjusting member 101 is of carbon, it may be of metal or ceramics.

As described above, a difference in temperature between regions of reaction vessel 102 is made by varying the height of interspace 106 formed between the thermal conductivity adjusting member 101 and the outer surface of reaction vessel 102. Therefore, the semiconductor film formation device of this embodiment can control the temperature distribution and gas concentration distribution in the reaction vessel 102 without complicating the device structure.

Second Embodiment

FIG. 5 is a cross sectional view showing a semiconductor film formation device in the second preferred embodiment of the invention.

Different from the first embodiment, the cooling jacket 103 of stainless steel is connected to the reaction vessel 102 of silica glass through a thermal conductivity adjusting member 107 that is composed of members 108 and 110 which are of stainless steel and a member 109 of carbon. In this structure, since the thermal conductivity of stainless steel members 108 and 110 is greater than that of carbon member 109, a portion of reaction vessel 102 to contact the stainless steel members 108 and 110 is cooled more rapidly than that to contact the carbon member 109. Therefore, the semiconductor film formation device of this embodiment can have the same effect as the first embodiment such that a difference in temperature between regions of reaction vessel 102 is made.

Under the same conditions as the first embodiment, semiconductor films are grown by using the semiconductor film formation device of this embodiment, which is provided with the thermal conductivity adjusting member 101, and by using a semiconductor film formation device without the thermal conductivity adjusting member 101. Then, between the semiconductor films thus grown, its average growth rate and in-plane thickness distribution are evaluated. The average growth rate is increased to 12 nanometers/sec. in case of with the thermal conductivity adjusting member 101, while it is 10 nanometers/sec. in case of without the thermal conductivity adjusting member 101. The in-plane thickness distribution is ±0.9 percents in case of with the thermal conductivity adjusting member 101, while it is ±2 percents in case of without the thermal conductivity adjusting member 101. Thus, the evenness of film thickness is improved in this embodiment.

Figure 6:
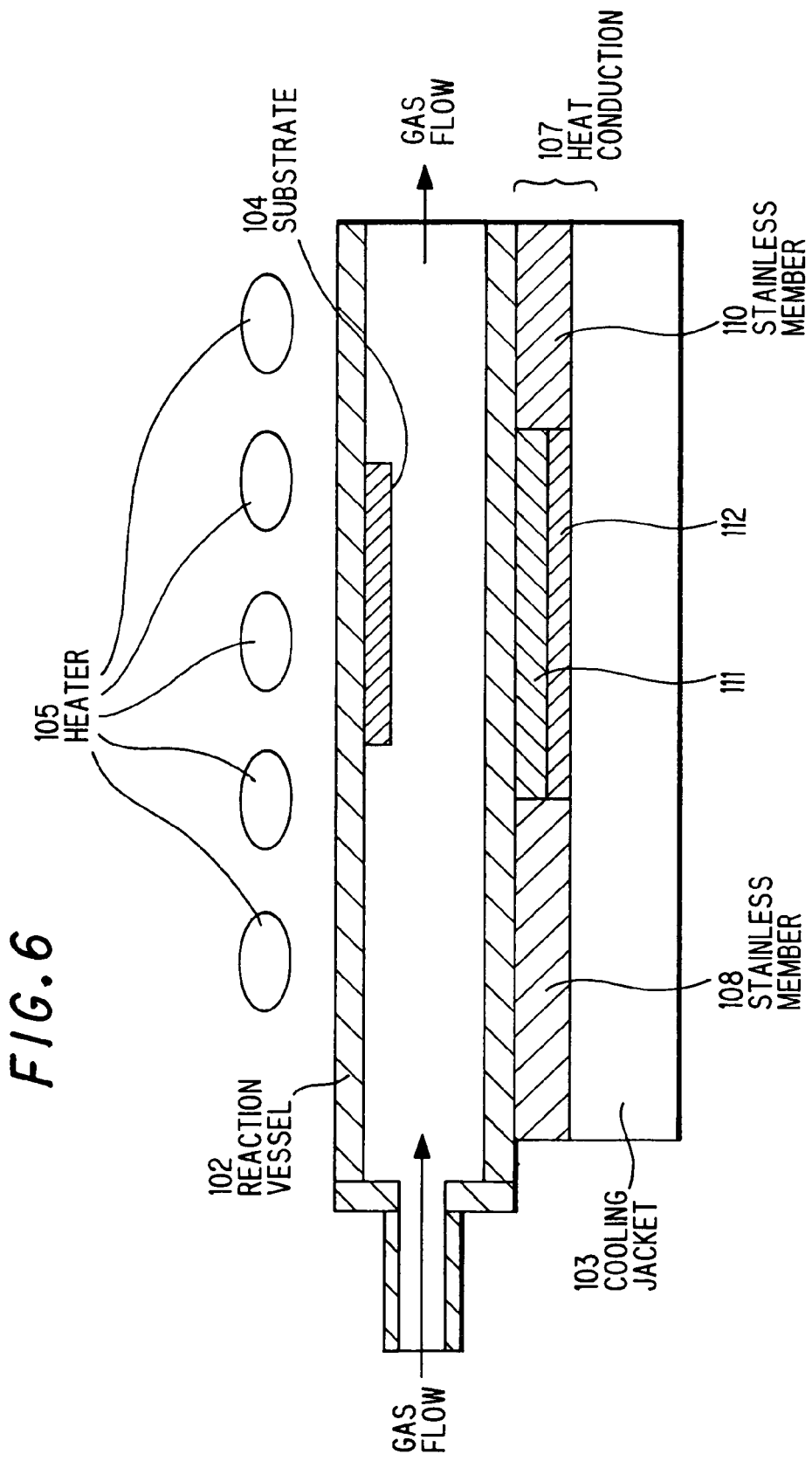
FIG. 6 is a schematic cross sectional view showing a modification of the semiconductor film formation device in the second embodiment.

Although in this embodiment the members 108, 109 and 110 composing the thermal conductivity adjusting member 101 each have a single structure, they may be structured such that, for example, the member 109 is formed by vertically stacking members 111, 112 with different thermal conductivities as shown in FIG. 6. In this way, the temperature distribution in reaction vessel 102 can be controlled.

Although the members 108, 109 and 110 of this embodiment are of carbon or stainless steel, they may be of metal such as copper and aluminum or ceramics.

As described above, a difference in temperature between regions of reaction vessel 102 is made by varying the thermal conductivity of thermal conductivity adjusting member 107. Therefore, the semiconductor film formation device of this embodiment can control the temperature distribution and gas concentration distribution in the reaction vessel 102 without complicating the device structure.

Third Embodiment

Figure 7:
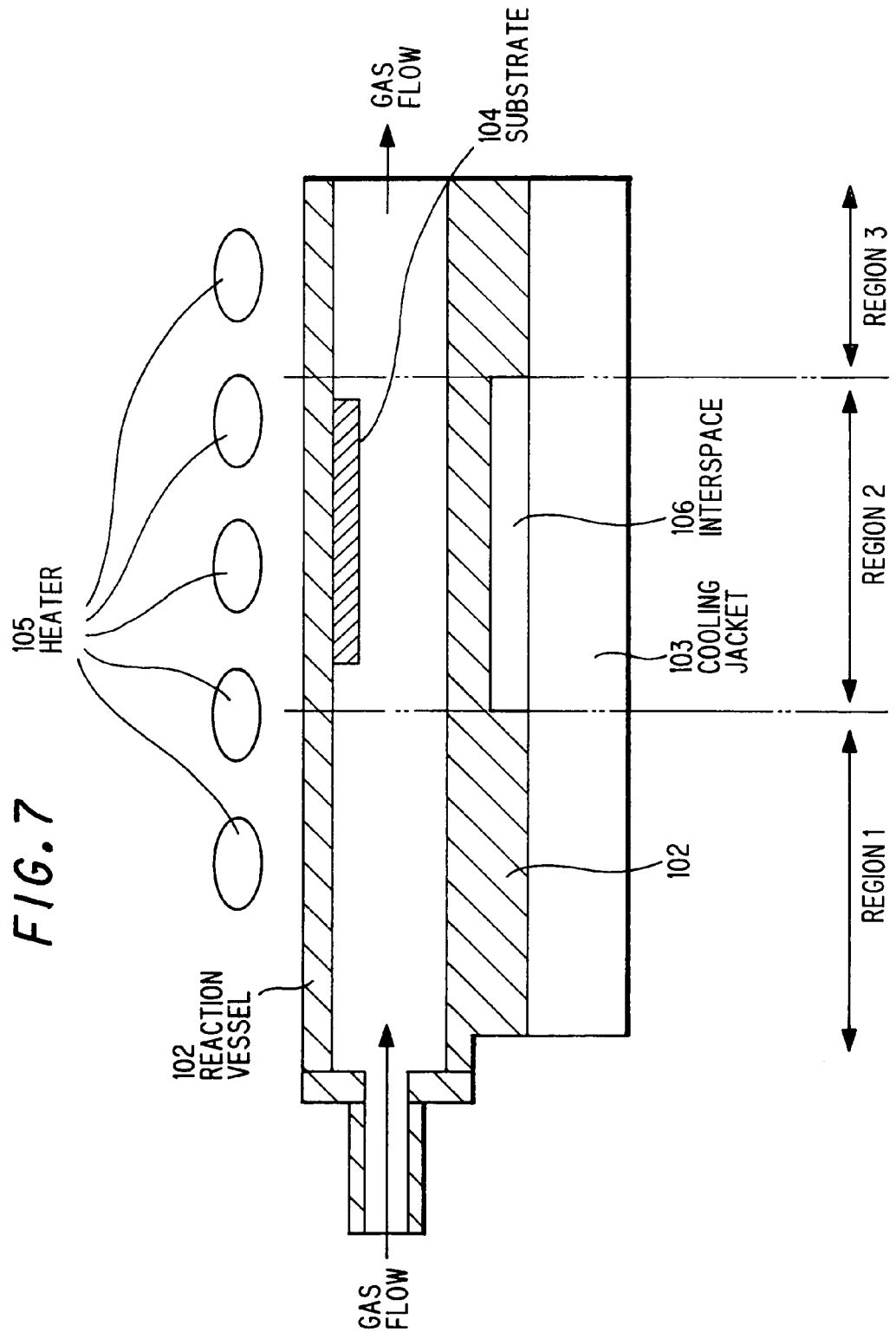
FIG. 7 is a schematic cross sectional view showing a semiconductor film formation device in a third preferred embodiment of the invention.

FIG. 7 is a cross sectional view showing a semiconductor film formation device in the third preferred embodiment of the invention.

Different from the preceding embodiments, the thickness of reaction vessel 102 wall where the reaction vessel 102 of silica glass is next to the cooling jacket 103 of stainless steel is changed between regions thereof as shown in FIG. 7.

In this structure, the cooling effect is relatively large in regions 1 and 3 where the reaction vessel 102 has a thick wall to contact the cooling jacket 103 and is relatively small in region 2 where the reaction vessel 102 has a thin wall to neighbor the cooling jacket 103 through the interspace 106. Therefore, the semiconductor film formation device of this embodiment can have the same effect as the preceding embodiments with the thermal conductivity adjusting member such that a difference in temperature between regions of reaction vessel 102 is made.

Under the same conditions as the first embodiment, semiconductor films are grown by using the semiconductor film formation device of this embodiment which has the reaction vessel 102 with a changed wall thickness between regions and by using a semiconductor film formation device which has the reaction vessel 102 without such a changed wall thickness. Then, between the semiconductor films thus grown, its average growth rate and in-plane thickness distribution are evaluated. The average growth rate is increased to 11.8 nanometers/sec. in case of the reaction vessel 102 with changed wall thickness, while it is 10 nanometers/sec. in case of the reaction vessel 102 without changed wall thickness. The in-plane thickness distribution is ±1.1 percents in case of the reaction vessel 102 with changed wall thickness, while it is ±2 percents in case of the reaction vessel 102 without changed wall thickness. Thus, the evenness of film thickness is improved in this embodiment.

Fourth Embodiment

Although in the preceding embodiments the horizontal type semiconductor film formation devices are explained that gas flows in one direction in the reaction vessel 102, the invention can be also applied to a semiconductor film formation device with multiple gas flow directions.

Figure 8:
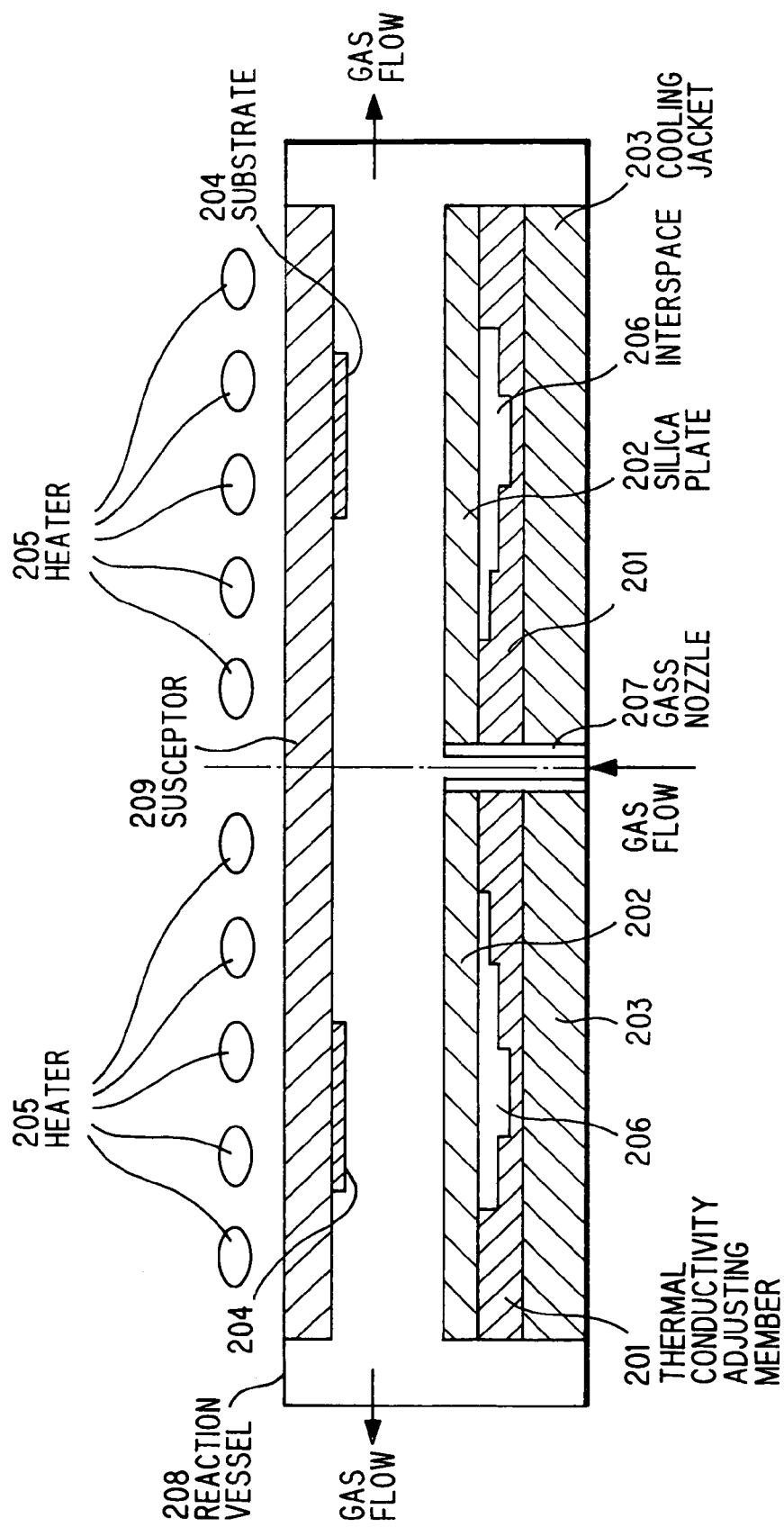
FIG. 8 is a schematic cross sectional view showing a semiconductor film formation device in a fourth preferred embodiment of the invention.

FIG. 8 is a cross sectional view showing a semiconductor film formation device in the fourth preferred embodiment of the invention.

A reaction vessel 208 is provided with a susceptor 209 of carbon disposed on its upper inner surface and a water-cooling jacket 203 of stainless steel on its lower inner surface. A silica plate 202 is disposed on the water-cooling jacket 203 through a thermal conductivity adjusting member 201 of stainless steel. A gas nozzle 207 is disposed connected to the center position of reaction vessel 208. Two substrates 204 of single-crystal gallium arsenide are disposed on the lower surface of susceptor 209 such that they are positioned at an equal distance from the gas nozzle 207. The substrates 204 and the susceptor 209 are heated to an average temperature of 600° C. by a heater 205 disposed on the reaction vessel 208.

The thermal conductivity adjusting member 201 is structured such that there is formed an interspace 206 having a variable height along the direction of gas flow between the thermal conductivity adjusting member 201 and the lower surface of silica plate 202.

In this device, source gases of arsine, trimethylgallium and carrier gas of hydrogen to be introduced into the reaction vessel 208 through the gas nozzle 207 move through a space surrounded by the susceptor 209 and the silica plate 202 in the radial direction, passing through the surface of the substrate 204, discharged from the circumferential edge of the reaction vessel 208. In this structure, since the cross-section area of gas flow region increases according as being close to the circumference of device, the gas flow rate lowers rapidly. Due to the lowering of gas flow rate, the influence of thermal diffusion to the concentration distribution of source gas increases. Therefore, in order to form a semiconductor film with even thickness, it is highly effective to control the internal temperature distribution of reaction vessel 208 by providing the thermal conductivity adjusting member 201 of this embodiment.

Semiconductor films are grown by using the semiconductor film formation device of this embodiment, which is provided with the thermal conductivity adjusting member 201, and by using a semiconductor film formation device without the thermal conductivity adjusting member 201. Then, between the semiconductor films thus grown, its average growth rate and in-plane thickness distribution are evaluated. The average growth rate is increased to 15 nanometers/sec. in case of with the thermal conductivity adjusting member 201, while it is 12 nanometers/sec. in case of without the thermal conductivity adjusting member 201. The in-plane thickness distribution is ±0.6 percents in case of with the thermal conductivity adjusting member 201, while it is ±1.8 percents in case of without the thermal conductivity adjusting member 201. Thus, the evenness of film thickness is improved in this embodiment.

Although in this embodiment the thermal conductivity adjusting member 201 is formed having different thicknesses between regions, it may be of materials with different thermal conductivities between regions as in the second embodiment. Alternatively, as shown in FIG. 9, a silica plate 202 with different thicknesses between regions may be used.

Although, in the above embodiments, the thermal conductivity is controlled in the direction parallel to gas flow, the invention can be applied to the other control direction of thermal conductivity. For example, by controlling the thermal conductivity in the direction vertical to gas flow, the effect of controlling the internal temperature distribution of reaction vessel can be obtained. As a result, a semiconductor film that has an excellent evenness in thickness and composition ratio can be obtained.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor film formation device, comprising:
a reaction vessel that includes a gas flow path to allow a source gas to pass through, a substrate mount site upon which to mount a substrate being provided in the gas flow path inside the reaction vessel, said substrate mount site being located on an inside surface of said reaction vessel along a first side of said reaction vessel;
a heater that is disposed along only a single side of said reaction vessel, outside of the reaction vessel on said first side along which the substrate mount site inside the reaction vessel is mounted;
a cooling device that is disposed along only a single side of said reaction vessel, outside of the reaction vessel on a second side substantially directly opposite to the heater, said cooling device controlling an internal temperature of the reaction vessel in a first section of the gas flow path where the substrate mount site is located; and
a thermal conductivity adjusting member that is disposed between the reaction vessel and the cooling device,
wherein the thermal conductivity adjusting member allows the first section along the gas flow path where the substrate mount site is located to have a thermal conductivity different from that of a second section along the gas flow path, in order to lower a thermal diffusion effect of the source gas in the first section, thereby forming a temperature gradient in the reaction vessel by providing a difference in temperature between regions of the reaction vessel.

2. The semiconductor film formation device according to claim 1, wherein:
the first section comprises an interspace formed between the reaction vessel and the thermal conductivity adjusting member.

3. The semiconductor film formation device according to claim 2, wherein:
the interspace has a varying height along the gas flow path.

4. The semiconductor film formation device according to claim 1, wherein:
the first section comprises a material having a thermal conductivity that is different from a thermal conductivity of a material of the second section.

5. A semiconductor film formation device, comprising:
a reaction vessel that includes a gas flow path to allow a source gas to pass through and a substrate mount site on an inside surface of the reaction vessel to mount a substrate in the gas flow path, said substrate mount site being located on a first side of said reaction vessel;
a heater that is disposed along only one side of the reaction vessel, outside of the reaction vessel on said first side of the reaction vessel as the substrate mount site is located, the heater thereby being close to the substrate mount site; and
a cooling device to control an internal temperature of the reaction vessel in a section of the gas flow path wherein the substrate mount site is located, the cooling device disposed along only one side of the reaction vessel, outside of the reaction vessel on a second side of said reaction vessel substantially directly opposite to said first side of said reaction vessel that the heater is located,
wherein a wall thickness of the reaction vessel is smaller in the section along the gas flow path where the substrate mount site is located, thereby forming an interspace between the reaction vessel and the cooling device to lower a thermal diffusion effect of the source gas in the section of the gas flow at the location of the substrate mount site, thereby forming a temperature gradient in the reaction vessel by providing a difference in temperature between regions of the reaction vessel.

6. The semiconductor film formation device according to claim 5, wherein:
the interspace has a height that varies along the gas flow path.

7. A semiconductor film formation device, comprising:
a reaction vessel that includes a gas flow path to allow a source gas to pass through and a substrate mount site provided in the gas flow path to mount a substrate, said substrate mount site being located on an inside surface of said reaction vessel along a first side thereof;
a heater that is disposed along only a single side of the reaction vessel, outside of the reaction vessel along said first side and close to the substrate mount site;
a cooling device that is disposed along only a single side of the reaction vessel, outside of the reaction vessel on a second side of said reaction vessel, said second side being substantially directly opposite to the first side of said reaction vessel along which said heater is located, the cooling device controlling an internal temperature of the reaction vessel in a vicinity of the substrate mount site;
a plate member that is disposed along said second side of said reaction vessel opposite to the substrate mount site in the gas flow path; and a thermal conductivity adjusting member that is disposed between the cooling device and the plate member, wherein the thermal conductivity adjusting member provides a first section along the gas flow path with a thermal conductivity different from a second section along the gas flow path, to lower a thermal diffusion effect of the source gas in the first section, thereby forming a temperature gradient in the reaction vessel by providing a difference in temperature between regions of the reaction vessel.

8. The semiconductor film formation device according to claim 7 wherein:

the first section comprises an interspace formed between the reaction vessel and the thermal conductivity adjusting member.

9. The semiconductor film formation device according to claim 8, wherein:

the interspace has a height that varies along the gas flow path.

10. The semiconductor film formation device according to claim 8, wherein:

the first section comprises a material whose thermal conductivity is different from that of a the second section.

11. A semiconductor film formation device, comprising:

a reaction vessel that includes a gas flow path to allow a source gas to pass through and a substrate mount site provided in the gas flow path to mount a substrate, said substrate mount site being located on an inside surface of said reaction vessel on a first side thereof;

a heater that is disposed along only a single side of said reaction vessel, outside of the reaction vessel along said first side and close to the substrate mount site;

a cooling device that is disposed along only a single side of said reaction vessel, outside of the reaction vessel on a second side thereof said second side being substantially directly opposite to the first side along which the heater is disposed, to control an internal temperature of the reaction vessel in a vicinity of the substrate mount site; and a plate member that is disposed along said second side, opposite to the substrate mount site in the gas flow path, wherein the reaction vessel includes a wall thickness that is smaller in a first section along the gas flow path than a wall thickness in a second section, such as to thereby form an interspace between the reaction vessel and the cooling device to lower a thermal diffusion effect of the source gas in the first section, thereby forming a temperature gradient in the reaction vessel by providing a difference in temperature between regions of the reaction vessel.

12. The semiconductor film formation device according to claim 11, wherein:

the interspace has a varying height along the gas flow path.

13. The semiconductor film formation device according to claim 1, wherein said gas flow path is substantially parallel with an exposed upper surface of said substrate as mounted upon said substrate mount site.

14. The semiconductor film formation device according to claim 5, wherein said gas flow path is substantially parallel with an exposed upper surface of said substrate as mounted upon said substrate mount site.

15. The semiconductor film formation device according to claim 7, wherein said gas flow path is substantially parallel with an exposed upper surface of said substrate as mounted upon said substrate mount site.

16. The semiconductor film formation device according to claim 11, wherein said gas flow path is substantially parallel with an exposed upper surface of said substrate as mounted upon said substrate mount site.

* * * * *